United States Patent [19]
Kawazoe et al.

[11] Patent Number: 4,701,635
[45] Date of Patent: Oct. 20, 1987

[54] CURRENT DRIVING CIRCUIT WITH CMOS INVERTER

[75] Inventors: Akio Kawazoe; Satoru Inoue, both of Tokyo, Japan

[73] Assignee: Oki Electric Industry Co., Ltd., Tokyo, Japan

[21] Appl. No.: 813,767

[22] Filed: Dec. 27, 1985

[30] Foreign Application Priority Data

Dec. 27, 1984 [JP] Japan ................................. 59-276762

[51] Int. Cl.[4] ...................... H03K 3/26; H03K 17/60; H03K 17/687; G01D 15/10
[52] U.S. Cl. .................................... 307/270; 307/315; 307/570; 307/451; 307/585; 307/576; 307/579; 400/120; 346/76 PH
[58] Field of Search ............... 307/270, 315, 575, 576, 307/577, 579, 584, 585, 451, 570; 400/120; 346/76 PH

[56] References Cited
U.S. PATENT DOCUMENTS 4,164,747  8/1979  Gerstner .............................. 307/315
4,176,272 11/1979  Powers .......................... 346/76 PH
4,209,713  6/1980  Satou et al. ........................ 307/451
4,514,737  4/1985  Suzuki ............................ 346/76 PH

FOREIGN PATENT DOCUMENTS 0148466 11/1979  Japan ................................. 307/315
0032661  3/1980  Japan ................................. 307/451
0141827 11/1980  Japan ................................. 307/315

Primary Examiner—Stanley D. Miller
Assistant Examiner—Trong Quang Phan
Attorney, Agent, or Firm—Wenderoth, Lind & Ponack

[57] ABSTRACT

A current driving circuit including a CMOS inverter, a Darlington amplifier, and a semiconductor switch, enables a printing head to be operated with low power consumption. The Darlington amplifier having a plurality of bipolar transistors is connected to an output part of the CMOS inverter. The semiconductor switch, which is connected to the Darlington amplifier, controls the bias voltage of the Darlington amplifier in synchronism with an input signal inputted to the CMOS inverter.

4 Claims, 4 Drawing Figures

CURRENT DRIVING CIRCUIT WITH CMOS INVERTER

BACKGROUND OF THE INVENTION

1. Field of the Invention

The present invention relates to a driving circuit, and more particularly to a current driving circuit most suitable for driving a printing head of a printer.

2. Description of the Prior Art

FIG. 1 shows a prior current driving circuit for heating, for example, a heating element of a printer thermal head.

The current driving circuit has a complementary MOS(CMOS) inverter 10 composed of P and N type MOS FETs 12 and 14, a Darlington circuit 20 including NPN type bipolar transistors 22 and 24, a current limiting resistor $R_1$, and pull-down resistors $R_2$, $R_3$.

An output terminal 18 of the current driving circuit is connected with a resistance element $R_l$ which, for example, corresponds to one of the heating elements of a thermal head.

In operation, when an "H" level input signal $V_{IN}$ is inputted to an input terminal 16, the CMOS inverter 10 outputs an "L" level signal, for thereby allowing a transistor 22 in the Darlington amplifier 20 to be switched off. Accordingly, no current flows through the resistance element $R_l$ and thus results in no heat production.

Then, when an "L" level input signal $V_{IN}$ is inputted to the input terminal 16, the CMOS inverter 10 outputs a "H" level signal, for thereby allowing the transistor 22 in the Darlington amplifier 20 to be switched on. Accordingly, a current flows through the resistance element $R_l$, for thereby causing heat to be produced to permit a picture element dot to be printed on a heat-sensitive paper sheet on a thermal printer.

However, in the prior art current driving circuit, when the resistance element R is heated, the output current of the CMOS inverter 10 flows through the P type MOS FET 12 and the resistors $R_1$ and $R_2$ from a power source $+V_{dd}$ to the ground potential, while the emitter current of the NPN type bipolar transistor 22 flows through the resistors $R_1$ and $R_3$ to the ground potential. Therefore, the prior art current driving circuit has a disadvantage in that power consumption is large in a printing mode of the printer.

For example, a thermal head which prints any information on a B4 type (256 mm wide) heat-sensitive paper sheet at a printing speed of 8 dots/mm includes 2048 heating elements therein, and a reactive current of approximately 430 mA flows therethrough in a printing mode if it is assumed that $R_2 = R_3 = 10$ KΩ.

Though the reactive current can be reduced with increased resistance values of the pull-down resistors R2 and R3, the operational speed is lowered and the noise margin would be narrowed due to degraded $B_{CER}$ voltage withstanding characteristics of the NPN transistors 22 and 24.

SUMMARY OF THE INVENTION

It is an object of the present invention to provide a current driving circuit which can operate at a higher speed with less power consumption.

Another object of the present invention is to provide a greatly simplified current driving circuit having a CMOS inverter therein.

Still another object of the present invention is to provide a current driving circuit most suitable for driving a printing head of a printer.

The above objects may be effected by providing a current driving circuit for driving a printing head of a printer comprising:

(a) a CMOS inverter composed of P and N type MOS transistors connected in series with each other, gate electrodes of said P and N type MOS transistors being connected to a signal input node, drains of said P and N type MOS transistors being connected to a signal output node, a source of said P type MOS transistor being connected to a first voltage source, a source of said N type MOS transistor being connected to ground; wherein an ON resistance of said P type MOS transistor is larger than that of said N type MOS transistor;

(b) a Darlington amplifier connected between said signal output node of said CMOS inverter and an output terminal for receiving a drive current, and composed of at least first and second NPN bipolar transistors, said first bipolar transistor having a base connected to said signal output node, an emitter, and a collector connected to said output terminal, said second bipolar transistor having a base connected to said emitter of said first bipolar transistor, an emitter connected to ground, and a collector connected to said output terminal; said output terminal being connected to a second voltage source having a higher voltage than that of said first voltage source through said printing head; and (c) an MOS semiconductor switching means connected between said signal input node and said emitter of said first bipolar transistor of said Darlington amplifier for controlling said Darlington amplifier so as to disconnect said emitter of said first bipolar transistor from ground in a printing mode during which said signal input node is at or near a ground potential.

The above and other objects, features, and advantages of the invention will be more apparent from the ensuring detailed description taken in conjunction with the accompanying drawings.

DESCRIPTION OF THE PREFERRED EMBODIMENT

Arrangement of the current driving circuit according to the present invention will be described with reference to FIG. 2.

Figure 1:
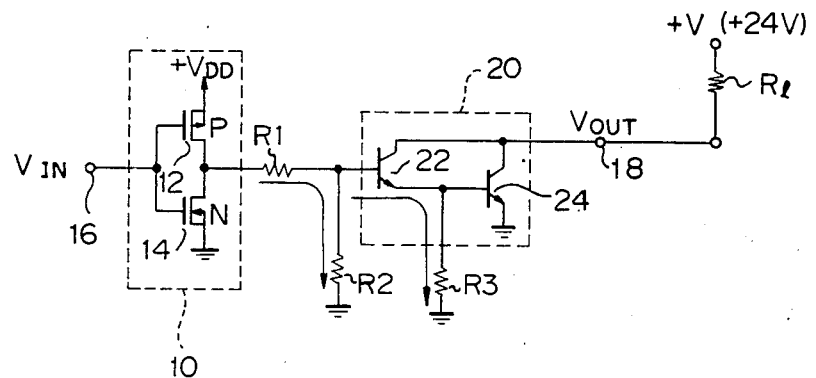
FIG. 1 shows a prior current driving circuit for driving a thermal head.
Figure 2:
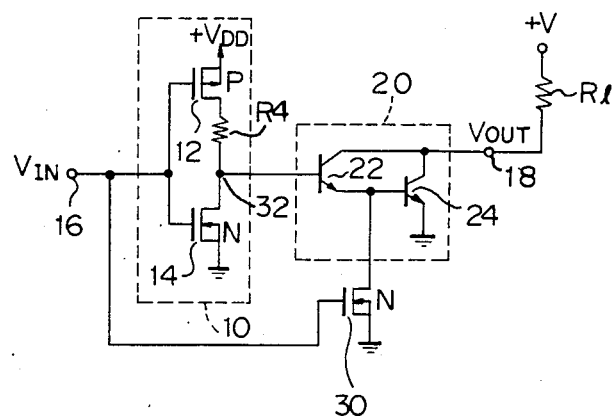
FIG. 2 illustrates a first embodiment of a current driving circuit according to the present invention.

As shown in FIG. 2, the current driving circuit includes therein a CMOS inverter 10 composed of P and N type MOS FETs, a Darlington amplifier 20 composed of NPN type transistors 22 and 24, and an N type MOS switching transistor 30.

The CMOS inverter 10 has a resistor $R_4$ (about 50 KΩ) connected between a drain of the P type transistor and an output node for limiting the base current through the NPN transistor 22 to a prescribed value.

The switching transistor 30 has a gate connected to a signal input terminal 16, a source connected to the ground potential, and a drain connected with an emitter of the NPN transistor 22, and controls the bias voltage of the Darlington amplifier 20 in synchronism with an input signal.

Figure 3:
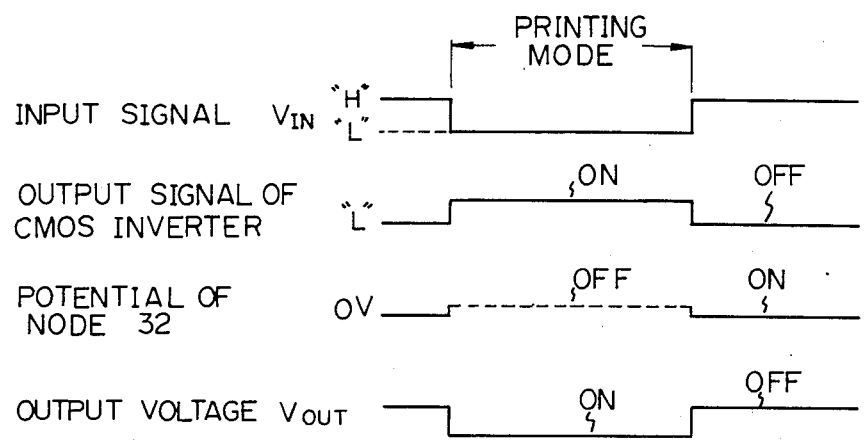
FIG. 3 is a timing chart illustrating operation of the current driving circuit of FIG. 2.

Then, operation of the current driving circuit of the present invention will be described with reference to FIG. 3.

In a non-printing mode of a thermal head, for example, when a "H" level input signal $V_{IN}$ is inputted to the input terminal 16, the output of the CMOS inverter 10 becomes a "L" level, while simultaneously the N MOS transistor 30 changes to a conduction state.

Therefore, the NPN transistors 22 and 24 in the Darlington amplifier 20 go to a non-conduction state, whereby no current flows through the heating element $R_l$ of the thermal head so that an output terminal 18 becomes a higher power source level V (+24 V).

In succession, in a printing mode of the thermal head, when a "L" level input signal $V_{IN}$ is inputted to the input terminal 16, the output of the CMOS inverter 10 changes to the "H" level so that the NPN transistors 22 and 24 of the Darlington amplifier 20 become conductive.

Since, in the instance, the N type MOS transistor 30 becomes non-conductive, a base current through the transistor 22 flows through the emitter of the transistor 22.

Accordingly, a driving current (about 50 mA) flowing through a heating segment $R_l$ of the thermal head flows from the output terminal 18 down to the ground potential via the transistor 24.

With the current driving circuit according to the present invention, no current flows, when the Darlington amplifier 20 is switched on, from the emitter of the transistor 22 to the ground potential through a pulldown resistor and thus a reactive current is eliminated without fail.

Figure 4:
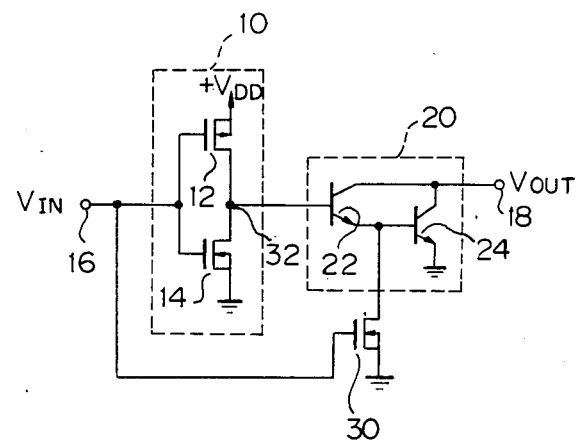
FIG. 4 illustrates a second embodiment of the current driving circuit according to the present invention.

In FIG. 4, illustrating another embodiment of the present invention, the current limiting resistor $R_4$ of FIG. 2 can be omitted provided that on-resistance of the P type MOS transistor is made high.

Since an area on a semiconductor chip occupied by the current driving circuit can be reduced, the circuit can be brought into high intergration.

Although in the present embodiment, the Darlington amplifier is constructed with two stages of NPN transistors, three or more stages of NPN or PNP type transistors may be profitably employed to improve a current amplification factor $\beta$.

According to the current driving circuit of the present invention, a thermal printer can not only be operated, but a printing head for an optical printer operated, without increasing a reactive current.

What is claimed is:

1. A current driving circuit for driving a printing head of a printer comprising:
   (a) a CMOS inverter composed of P and N type MOS transistors connected in series with each other, gate electrodes of said P and N type MOS transistors being connected to a signal input node, drains of said P and N type MOS transistors being connected to a signal output node, a source of said P type MOS transistor being connected to a first voltage source, a source of said N type MOS transistor being connected to ground; wherein an ON resistance of said P type MOS transistor is larger than that of said N type MOS transistor;
   (b) a Darlington amplifier connected between said signal output node of said CMOS inverter and an output terminal for receiving a drive current, and composed of at least first and second NPN bipolar transistors, said first bipolar transistor having a base connected to said signal output node, an emitter, and a collector connected to said output terminal, said second bipolar transistor having a base connected to said emitter of said first bipolar transistor, an emitter connected to ground, and a collector connected to said output terminal; said output terminal being connected to a second voltage source having a higher voltage than that of said first voltage source through said printing head; and
   (c) an MOS semiconductor switching means connected between said signal input node and said emitter of said first bipolar transistor of said Darlington amplifier for controlling said Darlington amplifier so as to disconnect said emitter of said first bipolar transistor from ground in a printing mode during which said signal input node is at or near a ground potential.

2. A current driving circuit according to claim 1, wherein said MOS semiconductor switching means comprises an N type MOS transistor having a gate connected to said signal input node, a drain connected to the emitter of said first bipolar transistor, and a source connected to ground.

3. A current driving circuit for driving a printing head of a printer comprising:
   (a) a CMOS inverter composed of P and N type MOS transistors connected in series with each other, gate electrodes of said P and N type MOS transistors being connected to a signal input node, drains of said P and N type MOS transistors being connected to a signal output node, a source of said P type MOS transistor being connected to a first voltage source, a source of said N type MOS transistor being connected to ground; wherein an ON resistance of said P type MOS transistor is larger than that of said N type MOS transistor;
   (b) a Darlington amplifier connected between said signal output node of said CMOS inverter and an output terminal for receiving a drive current, and composed of first and second NPN bipolar transistors, said first bipolar transistor having a base connected to said signal output node, an emitter, and a collector connected to said output terminal, said second bipolar transistor having a base connected to said emitter of said first bipolar transistor, an emitter connected to ground, and a collector connected to said output terminal; said output terminal being connected to a second voltage source having a higher voltage than that of said first voltage source through said printing head;
   (c) a current limiting resistor provided between said drain of said P type MOS transistor and said signal output node; and
   (d) an MOS semiconductor switching means connected between said signal input node and said emitter of said first bipolar transistor of said Darlington amplifier for connecting said Darlington amplifier so as to disconnect said emitter of said first bipolar transistor from ground in a printing mode during which said signal input node is at or near a ground potential.

4. A current driving circuit according to claim 3, wherein said MOS semiconductor switching means comprises an N type MOS transistor having a gate connected to said signal input node, a drain connected to the emitter of said first bipolar transistor, and a source connected to ground.

* * * * *